(12) United States Patent
Kang et al.

(10) Patent No.: US 9,638,400 B2
(45) Date of Patent: May 2, 2017

(54) OLED LIGHTING MODULE (71) Applicant: LG DISPLAY CO., LTD., Seoul (KR)

(72) Inventors: Minsoo Kang, Daejeon (KR); Ducksu Oh, Daejeon (KR); Sung-Ryun Lim, Incheon (KR); Dong-Hyuk Heo, Chungcheongbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 104 days.

(21) Appl. No.: 14/428,226

(22) PCT Filed: Sep. 13, 2013

(86) PCT No.: PCT/KR2013/008312
§ 371 (c)(1),
(2) Date: Mar. 13, 2015

(87) PCT Pub. No.: WO2014/042467
PCT Pub. Date: Mar. 20, 2014

(65) Prior Publication Data
US 2015/0247626 A1 Sep. 3, 2015

(30) Foreign Application Priority Data
Sep. 14, 2012 (KR) .................. 10-2012-0102408

(51) Int. Cl.
H01L 51/50 (2006.01)
F21V 19/00 (2006.01)
(Continued)

(52) U.S. Cl.
CPC ............ *F21V 19/0025* (2013.01); *F21K 9/20* (2016.08); *H01L 51/50* (2013.01); *H05B 33/06* (2013.01); *H05B 33/145* (2013.01); *H05B 33/28* (2013.01); *H05K 1/189* (2013.01); *H05K 3/4015* (2013.01); *F21Y 2105/00* (2013.01); *F21Y 2115/15* (2016.08); *H01L 2251/5361* (2013.01);
(Continued)

(58) Field of Classification Search
CPC ............ H01L 2251/5361; H01L 51/50; H01L 51/5203; H01L 51/56; H05B 33/06; H05B 33/145; H05B 33/28; H05K 1/189; H05K 2201/053; H05K 2201/056; H05K 2201/09845; H05K 2201/10318; H05K 3/323; H05K 3/4015; F21Y 2105/00; F21Y 2115/15
See application file for complete search history.

(56) References Cited

U.S. PATENT DOCUMENTS 5,565,733 A   10/1996 Krafcik et al.
7,211,738 B2* 5/2007 Lee ............... G02F 1/13452
                                           174/250
(Continued)

FOREIGN PATENT DOCUMENTS

CN    1414819 A    4/2003
CN    101371317 A  2/2009
(Continued)

*Primary Examiner* — Peggy Neils
(74) *Attorney, Agent, or Firm* — Dentons US LLP (57) ABSTRACT

The present invention discloses a lighting module using an organic light emitting device (OLED) and particularly, a lighting module using the OLED which stably couples a power supply terminal to an electrode pad which is formed on a glass substrate of an OLED illumination plate.

10 Claims, 7 Drawing Sheets (51) Int. Cl.
  *H05B 33/06* (2006.01)
  *H05B 33/14* (2006.01)
  *H05B 33/28* (2006.01)
  *H05K 1/18* (2006.01)
  *H05K 3/40* (2006.01)
  *F21K 9/20* (2016.01)
  *H05K 3/32* (2006.01)
  *F21Y 105/00* (2016.01)
  *F21Y 115/15* (2016.01)

(52) U.S. Cl.
  CPC ....... *H05K 3/323* (2013.01); *H05K 2201/053* (2013.01); *H05K 2201/056* (2013.01); *H05K 2201/09845* (2013.01); *H05K 2201/1031* (2013.01); *H05K 2201/10128* (2013.01); *H05K 2201/10318* (2013.01); *Y02P 70/611* (2015.11)

(56) References Cited

U.S. PATENT DOCUMENTS

| | | | |
|---|---|---|---|
| 8,207,664 B2 * | 6/2012 | Kawachi | H01L 51/5203 313/483 |
| 2002/0004441 A1 | 1/2002 | Kubik | |
| 2002/0017859 A1 | 2/2002 | Ishikawa et al. | |
| 2007/0176860 A1 | 8/2007 | Koh et al. | |
| 2009/0000807 A1 | 1/2009 | Han et al. | |
| 2009/0135571 A1 | 5/2009 | Chiang et al. | |
| 2009/0302729 A1 * | 12/2009 | Amelung | F21S 2/005 313/1 |
| 2009/0323349 A1 * | 12/2009 | Ochiai | F21K 9/00 362/296.01 |
| 2011/0089819 A1 | 4/2011 | Mo et al. | |
| 2011/0095701 A1 * | 4/2011 | Tanahashi | H01L 51/5203 315/291 |
| 2011/0121352 A1 * | 5/2011 | Hesse | H01L 27/301 257/99 |
| 2011/0290538 A1 | 12/2011 | Han et al. | |
| 2012/0153333 A1 * | 6/2012 | Yamazaki | H01L 51/5275 257/98 |

FOREIGN PATENT DOCUMENTS

| | | |
|---|---|---|
| JP | 2002043555 A | 2/2002 |
| JP | 2005108844 A | 4/2005 |
| JP | 2006-228455 A | 8/2006 |
| JP | 2009-523306 A | 6/2009 |
| JP | 2011-216353 A | 10/2011 |
| KR | 10-2003-0048802 A | 6/2003 |
| TW | 201116146 A1 | 5/2011 |

* cited by examiner

OLED LIGHTING MODULE

TECHNICAL FIELD

This application is a National Stage Entry of International Application No. PCT/KR2013/008312, filed Sep. 13, 2013, and claims the benefit of Korean Application No. 10-2012-0102408 filed on Sep. 14, 2012, all of which are hereby incorporated by reference in their entirety for all purposes as if fully set forth herein.

The present invention relates to a lighting module using an organic light emitting device (OLED) and more particularly, to a lighting module using the OLED which stably couples a power supply terminal to an electrode pad which is formed on a glass substrate of an OLED illumination plate.

BACKGROUND ART

The OLED illumination plate comprises a first surface which is formed to be entirely flat and a second surface which has a center surface and a border surface stepwisely formed around the center surface and a transparent electrode is formed on the stepped surface.

In order to assemble the OLED illumination plate for a lighting module, a power needs to be supplied through a transparent electrode. However, the transparent electrode is formed on a stepped surface and the stepped surface is formed of glass, which may cause difficulty in coupling for stable connection.

Korean Unexamined Patent Application Publication No. 10-2010-0062218 (published on Jun. 10, 2010) entitled "Large-area OLED lighting panel with radiant heat wire and lighting system with low-contact resistance" is a related art.

DETAILED DESCRIPTION OF THE INVENTION

Technical Problem

An object of the present invention is to provide a lighting module using an organic light emitting device which stably combines a printed circuit board for supplying a power with a stepped portion on which an electrode of an OLED illumination is formed.

Technical Solution

The present invention provides an OLED lighting module comprising: an OLED illumination plate which comprises a first surface which is formed to be entirely flat, a second surface which has a center surface and a border surface stepwisely formed around the center surface, and a transparent electrode which is formed on the stepped surface;

an FPCB substrate which comprises a main substrate portion which comprises a power terminal corresponding to the center surface and coupled to a power supply and a wing substrate portion which is formed to extend from the center surface in four directions and comprises a connection terminal corresponding to the transparent electrode; and a conductive adhesive film which is attached between the stepped surface and the wing substrate portion to electrically conduct the transparent electrode and the connection terminal.

The conductive adhesive film may use an anisotropic conductive film which is attached by thermal compression to provide electrical conduction only in a direction to which a pressure is applied.

Further, the present invention provides an OLED lighting module comprising:

the OLED illumination plate as described above;

a PCB substrate which has a size corresponding to the first surface and comprises a power terminal coupled to a power supply and a connection terminal in a position corresponding to the transparent electrode; and a conductive rod which has a thickness of the center surface corresponding to a step of a border surface and is attached to the transparent electrode of the OLED illumination plate by a conductive paste while being mounted on the connection terminal of the PCB substrate.

In this case, the conductive rod may be made of a brass material, the conductive paste may use a silver (Ag) paste, and the conductive rod may be divided into a plurality of conductive rods.

Furthermore, the present invention provides an OLED lighting module comprising:

the OLED illumination plate as described above;

a frame shaped FPCB substrate which has a shape corresponding to the stepped surface and comprises a connection terminal corresponding to the transparent electrode; and a conductive adhesive film which is attached between the stepped surface and the frame shaped FPCB substrate to electrically conduct the transparent electrode and the connection terminal.

In this case, the frame shaped FPCB substrate may comprise a connecting FPCB substrate portion which has a length corresponding to a length of each side and a coupling FPCB substrate portion which couples adjacent connecting FPCB substrate portions to each other.

Advantageous Effects

The OLED lighting module according to the present invention uses a flexible printed circuit board (FPCB), an anisotropic conductive film (ACF), or a brass rod to stably couple a power terminal to the OLED illumination plate.

As a result, it is possible to stabilize a quality of the OLED lighting module and allow mass production.

EXPLANATION OF REFERENCE NUMERALS AND SYMBOLS

10: OLED illumination plate
12: First surface

14: Center surface
16: Border surface
18: Second surface
100: FPCB substrate
110: Main substrate portion
120: Wing substrate portion
150: Conductive adhesive film
160: Reinforcement member
200: PCB substrate
210: Conductive rod
300: Frame shaped FPCB substrate
310: Connecting FPCB substrate portion
320: Coupling FPCB substrate portion

BEST MODE

Hereinafter, exemplary embodiments of an OLED lighting module according to the present invention will be described in detail with reference to the drawings.

Various advantages and features of the present invention and accomplishing methods thereof will become apparent from the following detailed description of exemplary embodiments with reference to the accompanying drawings. However, the present invention is not limited to exemplary embodiments disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Figure 1:
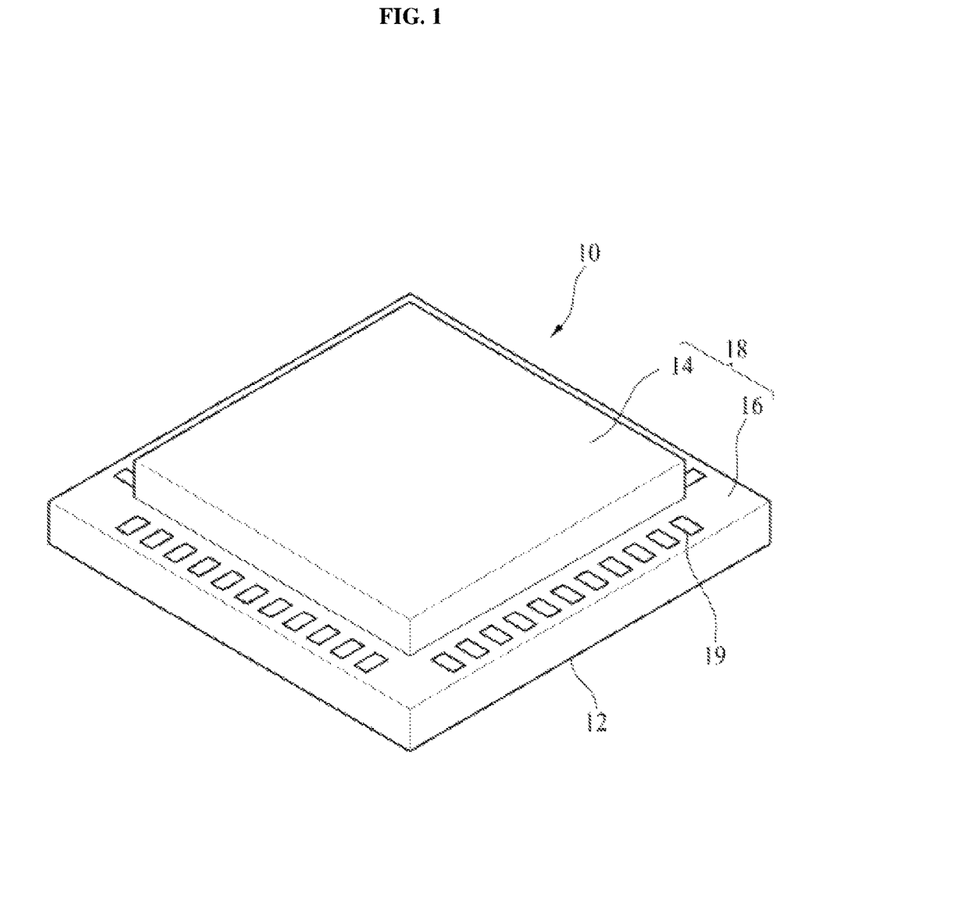
FIG. 1 is a perspective view illustrating an OLED illumination plate which is used for an OLED lighting module according to the present invention.

FIG. 1 is a perspective view illustrating an OLED illumination plate which is used for an OLED lighting module according to the present invention.

FIG. 1 is a perspective view illustrating an OLED illumination plate which is a test object of a substrate for a test of an OLED illumination plate according to the present invention.

As illustrated in the drawing, the OLED illumination plate 10 comprises a first surface 12 which is formed of a flat surface and a second surface 18 which is opposite to the first surface 12 and comprises a border surface 16 which is stepwisely formed at a border of a center surface 14.

An OLED is a device which emits light with a high brightness by low voltage direct current driving by laminating an organic hole transport layer or an organic field emitting layer between a lower electrode and an upper electrode.

The OLED illumination plate 10 comprises a transparent electrode 19 which is formed on the border surface 16 and is driven by coupling a power supply to the transparent electrode.

The present invention provides the OLED illumination plate 10 and an OLED lighting module in which a connection terminal is coupled to the transparent electrode of the OLED illumination plate 10 and provides a structure in which the connection terminal is stably packaged in the transparent electrode.

Figure 2:
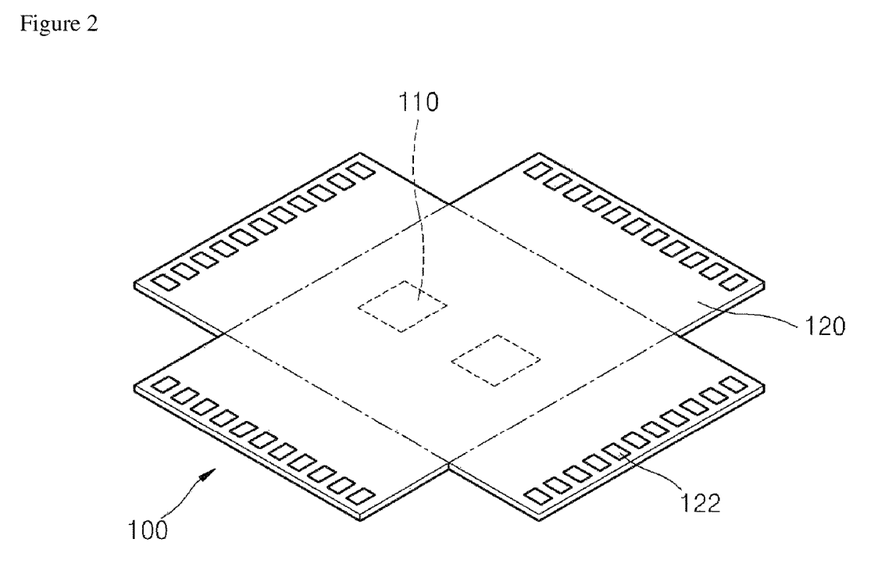
FIG. 2 is a perspective view illustrating an FPCB substrate which is used for an OLED lighting module according to a first exemplary embodiment of the present invention.
Figure 3:
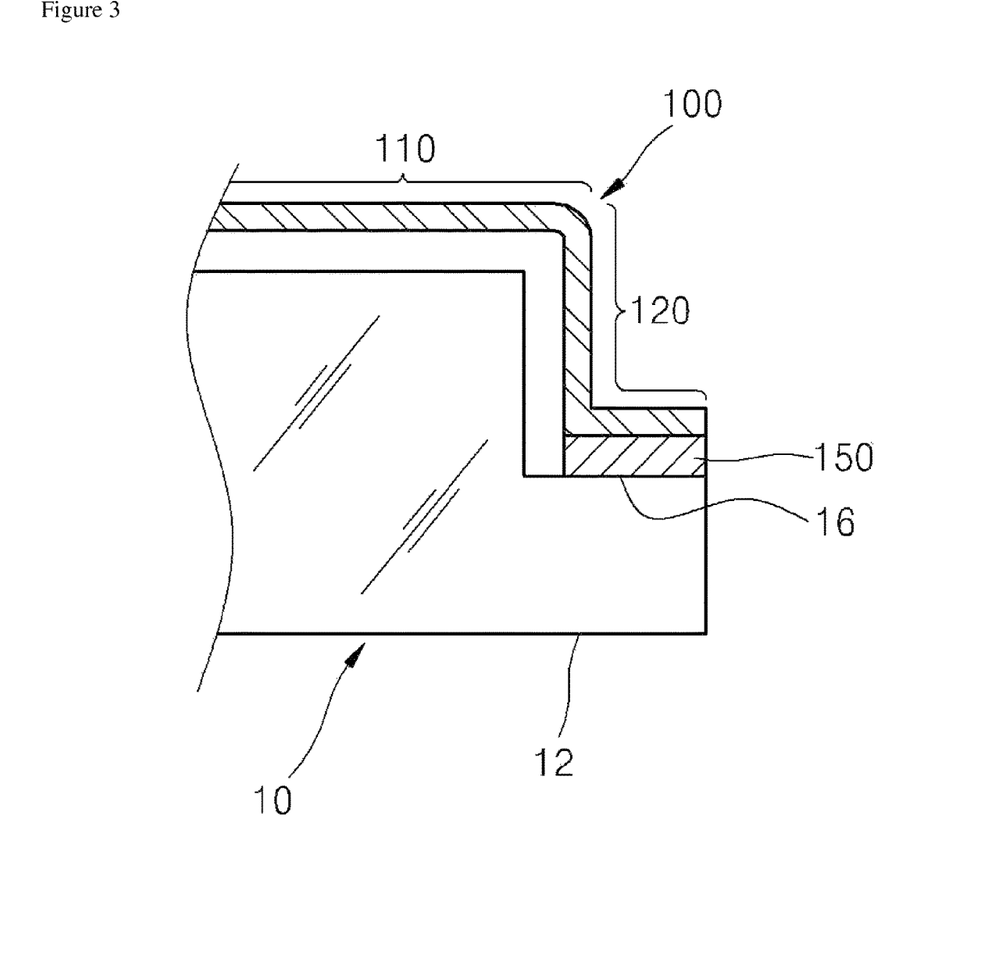
FIGS. 3 and 4 are cross-sectional views illustrating a combined status of the OLED lighting module according to the first exemplary embodiment of the present invention.
Figure 4:
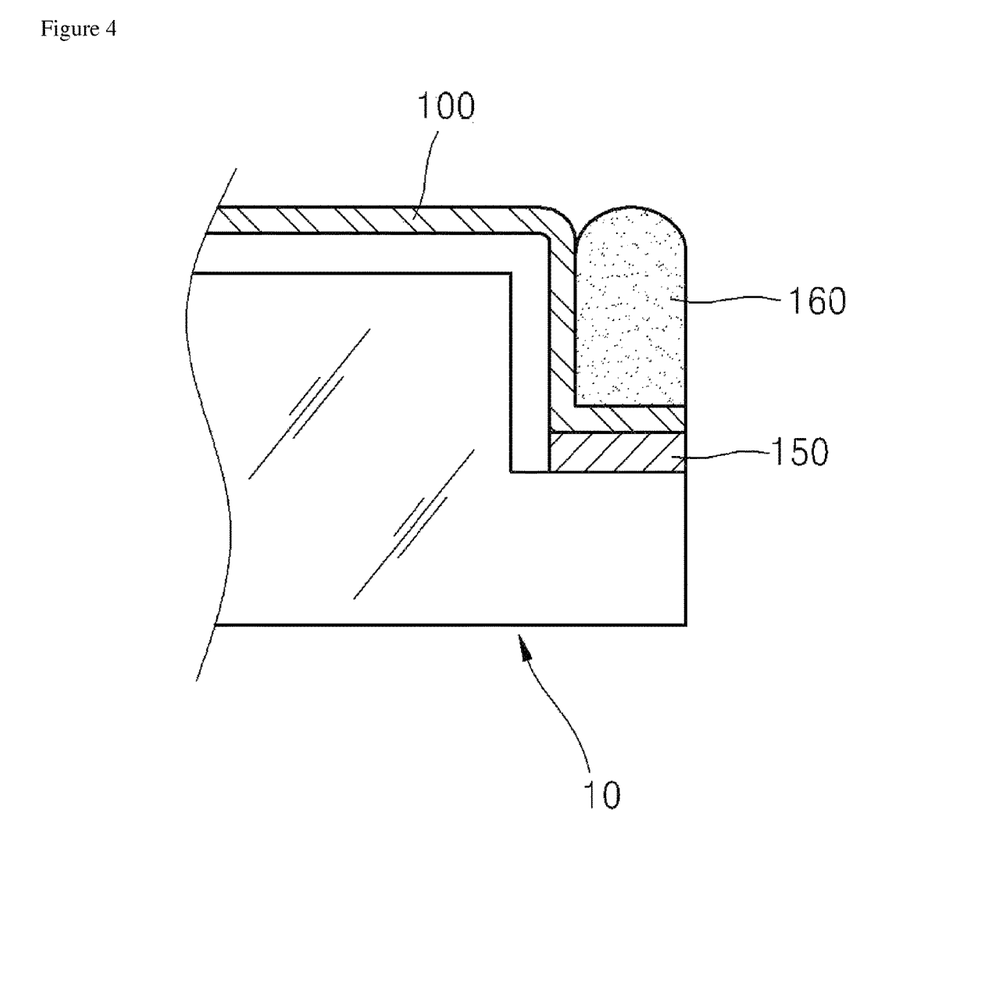

FIG. 2 is a perspective view illustrating an FPCB substrate which is used for an OLED lighting module according to a first exemplary embodiment of the present invention and FIGS. 3 and 4 are cross-sectional views illustrating a combined status of the OLED lighting module according to the first exemplary embodiment of the present invention.

According to the first exemplary embodiment of the present invention, the connection terminal is coupled to the transparent electrode using the FPCB substrate and an anisotropic conductive film.

The first exemplary embodiment comprises the above-described OLED illumination plate (10 of FIG. 1), an FPCB substrate 100 as illustrated in FIG. 2, and a conductive adhesive film 150 which couples and electrically conducts the transparent electrode (19 of FIG. 1) of the OLED illumination plate 10 and the connection terminal 122 of the FPCB substrate as illustrated in FIG. 3.

Referring to FIG. 2, the FPCB substrate 100 comprises a main substrate portion 110 which has a size corresponding to a center surface 14 of the OLED illumination plate 10 and wing substrate portions 120 which are formed to extend in four directions from the main substrate portion 110 and comprise the connection terminal 122 corresponding to the transparent electrode.

The FPCB substrate 100 comprises a power terminal 110 which is coupled to a power supply of the main substrate portion 110 on a surface opposite to a surface on which the connection terminal 122 is formed.

The main substrate portion 110 and the wing substrate portions 120 are integrally formed but boundaries of the main substrate portion 110 and the wing substrate portions 120 are represented by one-dot chain lines for the convenience of description.

According to the first exemplary embodiment, the FPCB substrate 100 is attached onto the first surface 12 of the OLED illumination plate 10 so that the transparent electrode (19 of FIG. 1) of the OLED illumination plate 10 is coupled to the connection terminal 122 of the FPCB substrate 100.

In this case, the transparent electrode of the OLED illumination plate 10 and the connection terminal 122 of the FPCB substrate 100 are adhered and connected to each other by the conductive adhesive film while facing each other.

When the connection terminal 122 of the FPCB substrate 100 is attached to the transparent electrode so as to face each other as described above, the power terminal 110 is disposed on an opposite surface of the attached surface so that the power terminal 110 is exposed to the outside (in FIG. 2, the power terminal is represented by a dotted line in order to indicate that the power terminal is formed on an opposite surface of the connection terminal. Accordingly, a power line of a power supply (normally, a driving driver) is coupled to the power terminal 110.

The FPCB substrate 100 is mounted with a circuit pattern which couples the power terminal 110 to the connection terminal 122.

In the meantime, an anisotropic conductive film which provides electrical conduction only in a direction to which a compressive force is applied and provides a binding force by thermal compression may be used for the conductive adhesive film.

As illustrated in FIG. 3, the wing substrate portion 120 of the FPCB substrate 100 may be bent as an L-shape to be attached onto the border surface 16 of the OLED illumination plate 10. Alternatively, in order to prevent damage of the stepped border surface 16, as illustrated in FIG. 4, a reinforcement member 160 which has a height similar to the step may be formed above the wing substrate portion 120 which is attached onto the border surface 16.

The reinforcement member 160 may be formed by applying a silicon resin or using a separate injection molding product or a rubber packing.

As illustrated in FIG. 4, when the reinforcement member 160 is formed on the step portion, the OLED lighting module has a rectangular parallelepiped panel shape which does not entirely have a step and thus a subsequent packaging process is easily performed. Further, even when no additional packaging is used, damage may be prevented and the FPCB substrate may be prevented from being peeled off.

A second exemplary embodiment of the present invention provides a structure in which a flat panel PCB substrate (in order to distinguish from the FPCB, a terminology of a hard PCB substrate is used, but a terminology of a PCB substrate is used in this description) is coupled to a transparent electrode of an OLED light guide plate using a conductive rod which is mounted in the PCB substrate.

Figure 5:
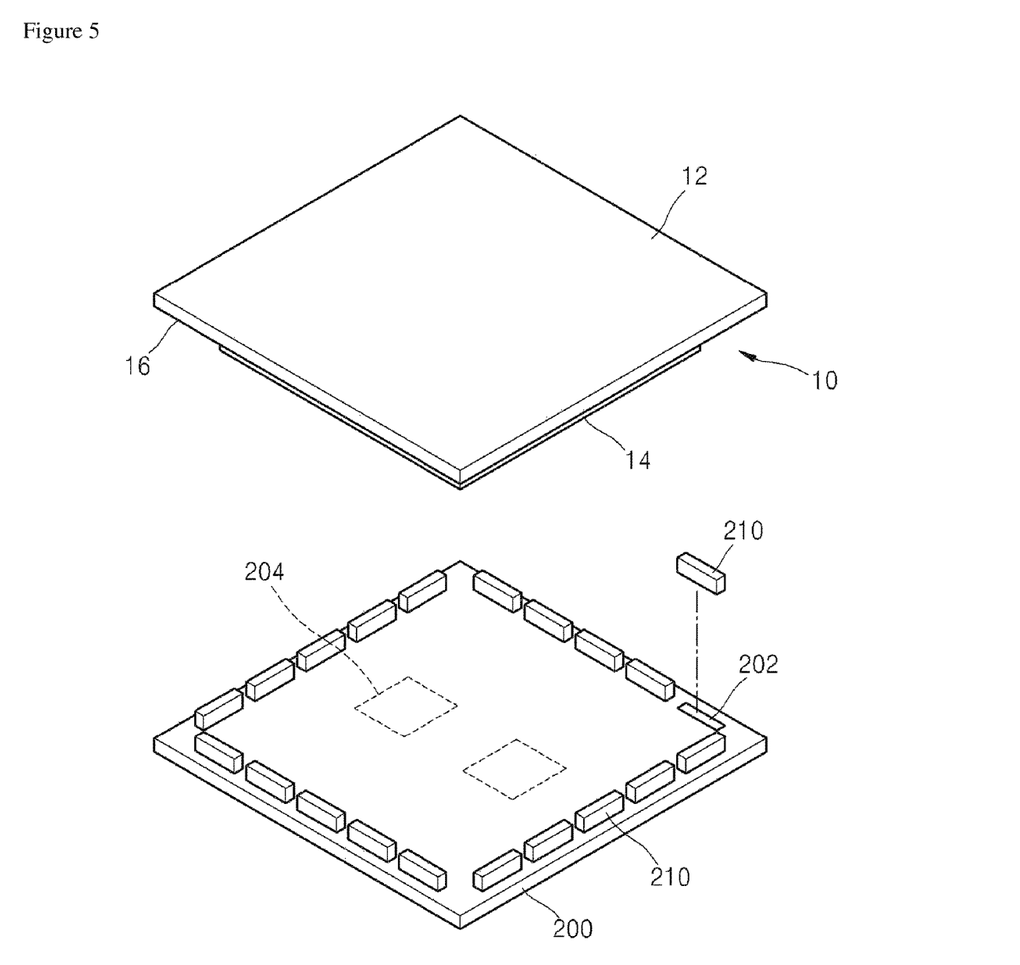
FIG. 5 is an exploded perspective view of an OLED lighting module according to a second exemplary embodiment of the present invention.

FIG. 5 is an exploded perspective view of an OLED lighting module according to a second exemplary embodiment of the present invention.

As illustrated in the drawing, a PCB substrate 200 according to the second exemplary embodiment has a size corresponding to a first surface 12 of an OLED illumination plate 10 and comprises a power terminal, which is coupled to a power supply, on one surface thereof and a connection terminal 202 in a position corresponding to the transparent electrode on the other surface.

A conductive rod 210 is mounted on the connection terminal 202. Depending on an arrangement pattern of the connection terminal 202, one conductive rod 210 may be formed on one side or a plurality of divided conductive rods may be formed on one side as described in the exemplary embodiment illustrated in the drawing.

The conductive rod 210 has a square column shape and a metal having an excellent conductivity may be used as a material. When considering a production cost, a strength, and a corrosion resistant, a brass rod may be desirably used, but the invention is not limited to the brass material or the metal material.

A surface of non-metal rod which is enclosed by a conductive member may be used.

The conductive rod 210 may be mounted in the connection terminal 202 of the PCB substrate 200 by a surface mounting method.

Figure 6:
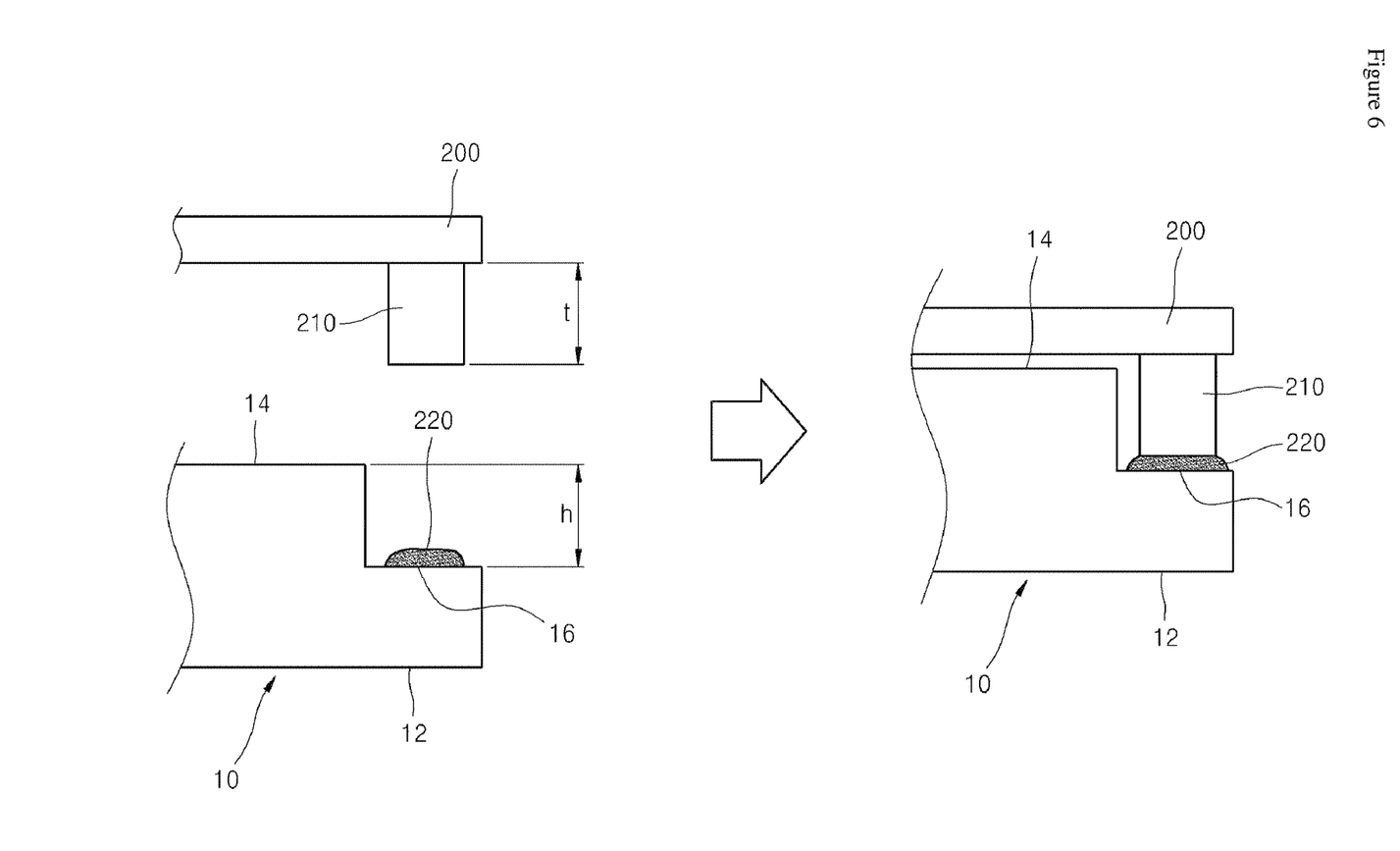
FIG. 6 is a cross-sectional view of a combining process of the OLED lighting module according to the second exemplary embodiment of the present invention.

FIG. 6 is a cross-sectional view of a combining process of the OLED lighting module according to the second exemplary embodiment of the present invention.

As illustrated in the drawing, a conductive paste 230 is applied in a region where the transparent electrode of the OLED illumination plate 10 is formed and then the PCB substrate 200 in which the conductive rod 210 is mounted is attached.

A thickness (t) of the conductive rod 210 may correspond to a height (h) of the step of the OLED illumination plate 10.

When the conductive rod 210 is mounted in the PCB substrate 200 to be attached on the OLED illumination plate 10 as described above, the conductive rod 210 fills the step so as to protect the border of the OLED lighting module.

The conductive paste 220 is required to have a conductivity and a binding force, so that a silver (Ag) paste may be representatively used.

Figure 7:
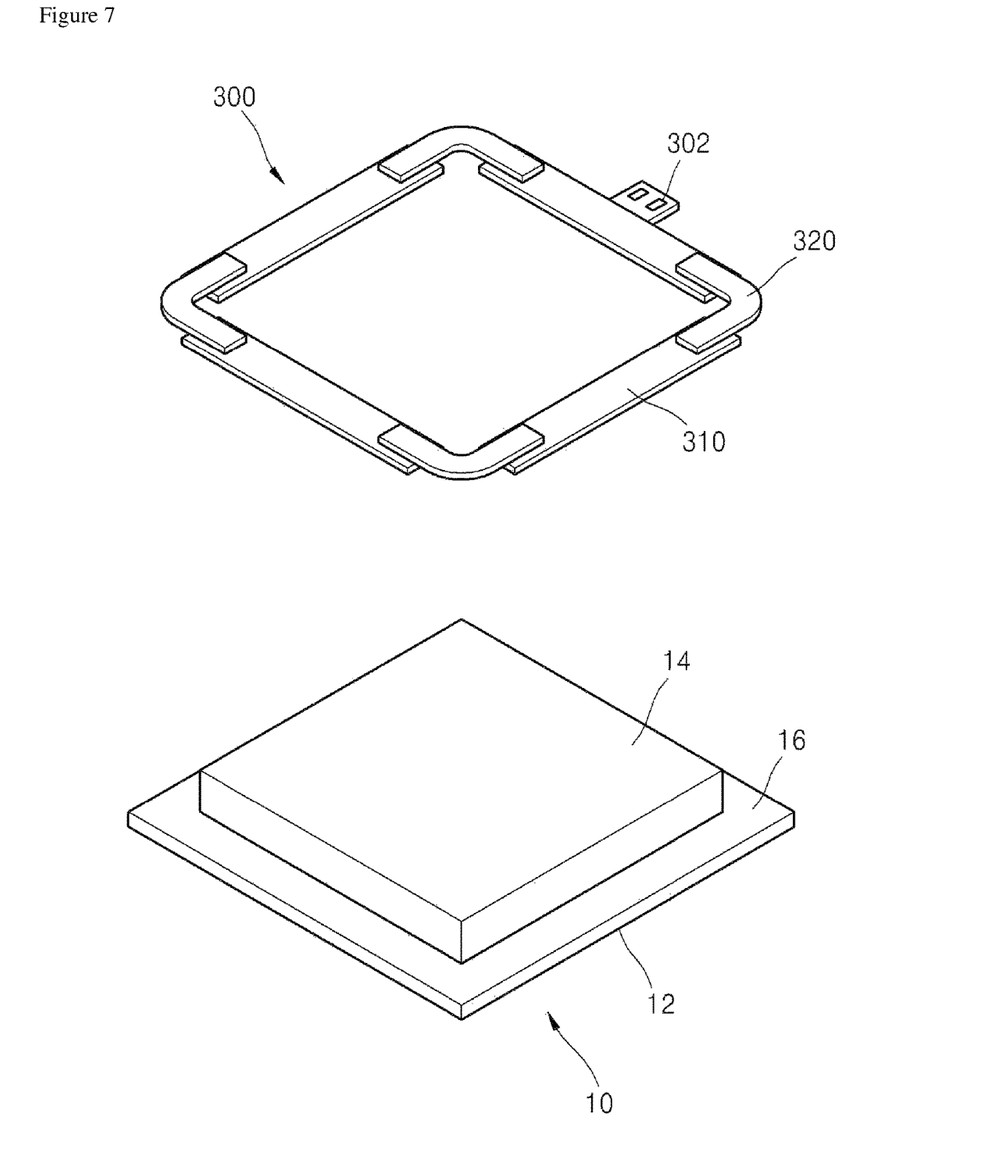
FIG. 7 is an exploded perspective view of an OLED lighting module according to a third exemplary embodiment of the present invention.

FIG. 7 is an exploded perspective view of an OLED lighting module according to a third exemplary embodiment of the present invention.

A third exemplary embodiment provides a structure in that a FPCB substrate is formed to have a frame shape corresponding to a border surface so as to be attached only on the border surface except a center surface of an OLED illumination plate. Such a structure provides an excellent radiation effect of the OLED lighting module and has advantages in view of a production cost and light-weight.

As illustrate in the drawing, the OLED lighting module according to the third exemplary embodiment of the present invention is formed such that a frame shaped FPCB substrate 300 is attached to a border surface 16 of an OLED illumination plate 10 using a conductive adhesive film (not illustrated).

The adhesion structure using the conductive adhesive film is the same as the first exemplary embodiment, and thus the redundant description will be omitted.

The frame shaped FPCB substrate 300 comprises a power terminal 302 which is formed to protrude, on one side. In the case of the frame shaped FPCB substrate 300, the power terminal 302 is formed to outwardly protrude so as to be coupled to the power supply.

The frame shaped FPCB substrate 300 comprises a connecting FPCB substrate portion 310 which has a length corresponding to a length of each side and has a connection terminal and a coupling FPCB substrate portion 320 which couples adjacent connecting FPCB substrate portions 310 to each other and is formed in an L shape.

The frame shaped FPCB substrate 300 comprises a positive electrode pattern which is coupled to a positive power terminal and a negative electrode pattern which is coupled to a negative power terminal. The frame shaped FPCB substrate 300 may have an arrangement in which the positive electrode pattern is formed inside and the negative electrode pattern is formed outside and vice versa so that two electrode patterns may be formed inside the frame shape.

As described above, the OLED lighting module according to the present invention provides a coupling structure which may stably supply a power to the transparent electrode of the OLED illumination plate so that the quality of the OLED lighting module may be stable.

Exemplary embodiments of the present invention have been described with reference to the accompanying drawings, but the present invention is not limited to the exemplary embodiments and may be modified in various forms, and it will be understood by a person with ordinary skill in the art, to which the present invention pertains, that exemplary embodiments of the present invention may be implemented in other specific forms without modifying the technical spirit or essential feature of the present invention. Thus, it is to be appreciated that exemplary embodiments described above are intended to be illustrative in every sense, and not restrictive.

The invention claimed is:

1. An OLED lighting module, comprising:
   an OLED illumination plate which comprises a first surface which is formed to be entirely flat, a second surface which has a center surface and a border surface stepwisely formed around the center surface, and a transparent electrode which is formed on the stepped surface;
   an FPCB substrate which comprises a main substrate portion which comprises a power terminal corresponding to the center surface and coupled to a power supply and a wing substrate portion which is formed to extend from the center surface in four directions and comprises a connection terminal corresponding to the transparent electrode;
   a reinforcement member which has a height substantially the same as a step formed above the wing substrate portion which is attached onto the border surface; and
   a conductive adhesive film which is attached between the stepped surface and the wing substrate portion to electrically conduct the transparent electrode and the connection terminal.

2. The OLED lighting module of claim 1, wherein the conductive adhesive film is an anisotropic conductive film which is attached by thermal compression to provide electrical conduction only in a direction to which a pressure is applied.

3. An OLED lighting module, comprising:
- an OLED illumination plate which comprises a first surface which is formed to be entirely flat, a second surface which has a center surface and a border surface stepwisely formed around the center surface, and a transparent electrode which is formed on the stepped surface;
- a flat panel PCB substrate which has a size corresponding to the first surface and comprises a power terminal coupled to a power supply and a connection terminal in a position corresponding to the transparent electrode; and
- a conductive rod which has a height of the center surface corresponding to a height of a step of the border surface and is attached to the transparent electrode of the OLED illumination plate by a conductive paste while being mounted on the connection terminal of the flat panel PCB substrate,
- wherein the conductive rod is formed between the connection terminal and the transparent electrode.

4. The OLED lighting module of claim 3, wherein the conductive rod is a brass material and the conductive paste is a silver (Ag) paste.

5. The OLED lighting module of claim 3, wherein the conductive rod is formed to be divided into a plurality of conductive rods.

6. An OLED lighting module, comprising:
- an OLED illumination plate which comprises a first surface which is formed to be entirely flat, a second surface which has a center surface and a border surface stepwisely formed around the center surface, and a transparent electrode which is formed on the stepped surface;
- a frame shaped FPCB substrate which has a shape corresponding to the stepped surface and comprises a connection terminal corresponding to the transparent electrode, and a power terminal formed to outwardly protruded; and
- a conductive adhesive film which is attached between the stepped surface and the frame shaped FPCB substrate to electrically conduct the transparent electrode and the connection terminal,
- wherein the frame shaped FPCB surrounds all of the corners of the center surface.

7. The OLED lighting module of claim 6, wherein the conductive adhesive film is an anisotropic conductive film which is attached by thermal compression to provide electrical conduction only in a direction to which a pressure is applied.

8. The OLED lighting module of claim 6, wherein the frame shaped FPCB substrate comprises a connecting FPCB substrate portion which has a length corresponding to a length of each side and a coupling FPCB substrate portion which couples adjacent connecting FPCB substrate portions to each other.

9. An OLED lighting module of claim 1, wherein the wing substrate portion is bent as an L-shape to be attached onto the border surface.

10. An OLED lighting module of claim 8, wherein the coupling FPCB substrate portion is formed in an L-shape.

* * * * *